(12) United States Patent
Soga et al.

(10) Patent No.: US 9,628,303 B2
(45) Date of Patent: Apr. 18, 2017

(54) RECEIVER APPARATUS AND FREQUENCY SELECTIVITY INTERFERENCE CORRECTION METHOD

(71) Applicant: Panasonic Corporation, Osaka (JP)

(72) Inventors: Shigeru Soga, Kanagawa (JP); Teruaki Hasegawa, Osaka (JP); Ippei Kanno, Kyoto (JP); Yoshinobu Matsumura, Osaka (JP); Hisateru Kobatake, Osaka (JP); Kouya Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 43 days.

(21) Appl. No.: 14/655,316

(22) PCT Filed: Nov. 29, 2013

(86) PCT No.: PCT/JP2013/007033
§ 371 (c)(1),
(2) Date: Jun. 24, 2015

(87) PCT Pub. No.: WO2014/103170
PCT Pub. Date: Jul. 3, 2014

(65) Prior Publication Data
US 2015/0358183 A1    Dec. 10, 2015

(30) Foreign Application Priority Data
Dec. 26, 2012  (JP) .................... 2012-282724

(51) Int. Cl.
*H04L 25/03*   (2006.01)
*H04L 27/26*   (2006.01)
(Continued)

(52) U.S. Cl.
CPC .. *H04L 25/03821* (2013.01); *H03M 13/6527* (2013.01); *H04L 1/0047* (2013.01);
(Continued)

(58) Field of Classification Search
CPC ... H04L 5/0023; H04L 27/2602; H04L 5/001; H04L 5/0073; H04W 72/082
See application file for complete search history.

(56) References Cited

U.S. PATENT DOCUMENTS

| 7,477,633 B2 | 1/2009 | Mujtaba |
| 7,558,328 B2 | 7/2009 | Mujtaba |

(Continued)

FOREIGN PATENT DOCUMENTS

| EP | 0 963 086 A2 | 12/1999 |
| EP | 1 054 541 A2 | 11/2000 |

(Continued)

OTHER PUBLICATIONS

ETRI Heejung Yu, "Repetition Schemes for TGah," IEEE 802.11-11/1490r0, Nov. 6, 2011, 11 pages.

(Continued)

*Primary Examiner* — Jung Park
(74) *Attorney, Agent, or Firm* — Seed IP Law Group LLP

(57) ABSTRACT

An OFDM receiver apparatus (100) receives a signal that includes an STF having a plurality of pilot subcarriers and a plurality of null subcarriers that are alternately arranged at predetermined frequency intervals in a transmission band and that includes a data part that is time-multiplexed with the STF. A null carrier extraction unit (151) extracts a plurality of null subcarrier frequency signals from the received signal. A power calculation unit (152) detects, based on the levels of the extracted signals, the interference levels of the plurality of subcarriers in the transmission band. A soft decision unit (112) uses the reliability of the plurality of subcarriers, which is calculated based on the detected interference levels, to perform a soft decision of a demodulated signal of the received data part. An error correction unit (113) performs, (Continued)

based on the result of the soft decision, an error correction, thereby reconstructing the data.

13 Claims, 13 Drawing Sheets

(51) Int. Cl.
    *H04L 25/06*     (2006.01)
    *H04L 1/00*     (2006.01)
    *H04L 5/00*     (2006.01)
    *H03M 13/45*     (2006.01)
    *H03M 13/00*     (2006.01)

(52) U.S. Cl.
    CPC ........ *H04L 25/067* (2013.01); *H04L 27/2613* (2013.01); *H04L 27/2647* (2013.01); *H03M 13/00* (2013.01); *H03M 13/45* (2013.01); *H04L 5/0007* (2013.01); *H04L 5/0048* (2013.01)

(56) References Cited

U.S. PATENT DOCUMENTS

| | | | |
|---|---|---|---|
| 7,835,748 B2 | 11/2010 | Beyer et al. | |
| 8,345,809 B2 | 1/2013 | Husen et al. | |
| 8,644,404 B2 | 2/2014 | Mashino et al. | |
| 8,964,522 B2 | 2/2015 | Mujtaba et al. | |
| 2003/0193889 A1* | 10/2003 | A. Jacobsen | H04L 27/2608 370/208 |
| 2005/0201268 A1* | 9/2005 | Aoki | H04B 7/10 370/208 |
| 2005/0278609 A1* | 12/2005 | Kim | H03M 13/3723 714/780 |
| 2006/0067415 A1 | 3/2006 | Mujtaba | |
| 2006/0072529 A1 | 4/2006 | Mujtaba | |
| 2007/0111663 A1 | 5/2007 | Beyer et al. | |
| 2008/0232239 A1 | 9/2008 | Mujtaba et al. | |
| 2011/0243268 A1 | 10/2011 | Mashino et al. | |
| 2012/0039379 A1 | 2/2012 | Husen et al. | |
| 2013/0058432 A1* | 3/2013 | Futatsugi | H04J 11/0036 375/296 |
| 2014/0024388 A1* | 1/2014 | Earnshaw | H04L 5/0073 455/452.2 |

FOREIGN PATENT DOCUMENTS

| | | |
|---|---|---|
| JP | 2954570 B1 | 9/1999 |
| JP | 3110423 B1 | 11/2000 |
| JP | 3363086 B2 | 1/2003 |
| JP | 2008-512963 A | 4/2008 |
| JP | 2008-544622 A | 12/2008 |
| JP | 4541353 B2 | 9/2010 |
| JP | 4774160 B2 | 9/2011 |
| JP | 5024197 B2 | 9/2012 |
| WO | 2010/070925 A1 | 6/2010 |

OTHER PUBLICATIONS

International Search Report dated Dec. 24, 2013, for corresponding International Application No. PCT/JP2013/007033, 6 pages.

Yong-Hwa Kim et al., "Joint Channel Estimation with Phase Noise Suppression and Soft Decision Decoding Scheme for OFDM-based WLANs," School of Electrical Engineering and Computer Science, Seoul National University, Seoul, Korea, IEEE 2005, 5 pages.

* cited by examiner

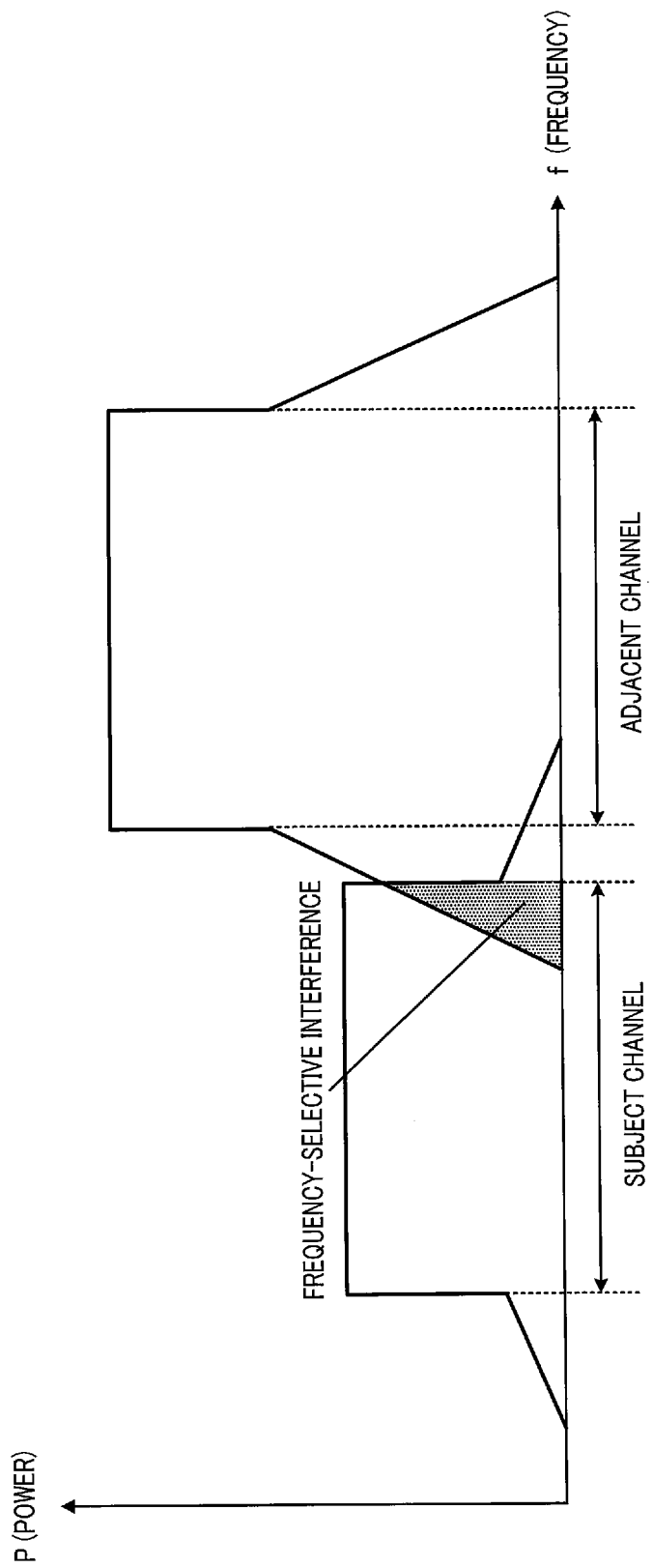

RECEIVER APPARATUS AND FREQUENCY SELECTIVITY INTERFERENCE CORRECTION METHOD

TECHNICAL FIELD

The present disclosure relates to a receiving apparatus and a frequency-selective interference correction method for correcting deterioration in reception performance due to the influence of frequency-selective interference caused by leakage power of an adjacent channel in data communication according to an OFDM (Orthogonal Frequency Division Multiplexing) scheme used in wireless LAN or the like.

BACKGROUND ART

Standardization efforts for the wireless LAN standard in IEEE 802.11 so far have mainly targeted indoor communication and has successively added physical layer standards mainly focusing on an increase in transmission capacity such as 802.11b (maximum 11 Mbps), 802.11a, 11g (maximum 54 Mbps), 802.11n (maximum 600 Mbps), and 802.11ac (maximum 6.9 Gbps). Meanwhile, as examination of smart meters to implement a smart grid has been well under way, the need for low rate and long-distance outdoor transmission is also increasing. There are also ongoing discussions about assignment of available specified low power radio frequencies and the like intended for such applications. Against this background, studies aiming at development of new communication standards using a sub GHz band (frequency band slightly lower than 1 GHz) have started and IEEE802.11 started up TGah (802.11ah), a task group working on wireless LAN standards using sub GHz frequency bands in 2010. A principal required specification in TGah (802.11ah) is "data rate of 100 kbps or higher and maximum transmission distance of 1 km."

IEEE 802.11a and subsequent standards including TGah (802.11ah) using an OFDM modulation scheme establish various kinds of synchronization using a preamble at the beginning of a packet to perform burst communication. A preamble is constructed of an STF (Short Training Field, which may also be called "short preamble") used for AGC (Automatic Gain Control) or coarse adjustment AFC (Automatic Frequency Control) and LTF (Long Training Field, which may also be called "long preamble") used for estimation of fine adjustment AFC or transmission path characteristic.

In order to efficiently use limited frequency resources, such an operation may be adopted that a plurality of adjacent channels are generally used by a plurality of users. However, in such an operation, in a certain receiving apparatus, received power of adjacent channels may be greater than received power of the channel intended for the certain apparatus (subject channel) due to the influence of fading or the like. For this reason, the operation in which adjacent channels are used by a plurality of users defines a spectral mask of a transmission signal, provides a frequency margin (which may also be referred to as "guard band") between channels and thereby reduces interference to the adjacent channels.

However, in an environment in which interference to the adjacent channels is large and there is such a DU ratio (desired signal to undesired signal ratio) that exceeds interference allowable by the spectral mask, guard band or the like, leakage power (which may also be referred to as "interference power or disturbance power") from the adjacent channels is mixed with the subject channel and interference from the adjacent channels may be produced as frequency-selective interference.

FIG. 13 illustrates an example of adjacent channel interference. In FIG. 13, the horizontal axis represents a frequency (f) and the vertical axis represents power (P). As shown in FIG. 13, part of a signal spectrum of a frequency band of an adjacent channel interferes with a signal spectrum of a frequency band (transmission band) of the subject channel, producing frequency-selective interference. Reception characteristics deteriorate due to data assigned to subcarriers in frequency domain affected by such frequency-selective interference.

Especially, 802.11ah assumes a long-distance transmission environment as described above. For this reason, in a situation in which a transmitting apparatus that transmits a signal intended for the channel used for the apparatus (hereinafter, may be referred to as "subject channel") is located far and a transmitting apparatus that transmits a signal intended for an adjacent channel is located near, the received power of the adjacent channel may be more likely to be greater than the received power of the subject channel.

As a method for reducing the influence of such frequency-selective interference, Patent Literature (hereinafter, referred to as "PTL") 1 proposes a method in which a receiving apparatus detects a subcarrier affected by frequency-selective interference, using a pilot signal frequency-multiplexed with data, applies erasure processing to the data assigned to the subcarriers and applies error correction to the data.

In addition, PTL 2 and PTL 3 propose a method in which a receiving apparatus calculates the magnitude of a variance of a demodulated signal for each subcarrier to which data is assigned (hereinafter referred to as "data subcarrier"), detects a subcarrier affected by frequency-selective interference based on the calculated magnitude of variance, determines the degree of reliability of the demodulated signal of the subcarrier based on the magnitude of variance, makes a soft decision by gradually assigning weights to the demodulated signal based on the determined degree of reliability and performs error correction regarding the soft decision result.

PTL 4 proposes a method in which a receiving apparatus receives an OFDM signal made up of a plurality of subcarriers in which pilot signals are inserted according to a certain rule, extracts the pilot signals, calculates transmission path characteristics of the pilot signals, calculates an error signal as a time variation from the transmission path characteristics of the pilot signals and transmission path characteristics of pilot signals calculated one period earlier, detects the degree of reliability of subcarriers affected by frequency-selective interference based on the value of the error signal, makes a soft decision by assigning weights to the demodulated signal based on the degree of reliability and performs error correction regarding the soft decision result.

PTL 5 proposes a method in which a receiving apparatus receives an OFDM signal in which a null subcarrier (subcarrier to which no signal is assigned) is inserted together with data at a predetermined subcarrier position, calculates received power of the null subcarrier and determines whether or not interference has occurred at each subcarrier position according to the calculated received power of the null subcarriers.

CITATION LIST

Patent Literature

PTL 1
Japanese Patent Publication No. 3363086
PTL 2
Japanese Patent Publication No. 2954570

PTL 3
Japanese Patent Publication No. 3110423
PTL 4
Japanese Patent Publication No. 4774160
PTL 5
WO10/070925

Non Patent Literature

NPL 1
Heejung Yu, Minho Cheng, Sok-Kyu Lee, "Repetition Schemes for TGah," IEEE 802.11 contribution, Doc. Number: 11/1490r1, November 2011 (URL:https://mentor.ieee.org/802.11/documents?is_group=00ah)

SUMMARY OF INVENTION

Technical Problem

The method disclosed in PTL 1 or PTL 4 of detecting reliability of subcarriers affected by frequency-selective interference using pilot signals is effective when pilot signals are periodically and dispersively multiplexed together with data in a symbol direction (time direction) and subcarrier direction (frequency direction) as in the cases of ISDB-T or DVB-T which are digital TV broadcasting standards. However, in 802.11, pilot signals multiplexed together with data are mapped on specific subcarriers. For this reason, the frequencies at which frequency-selective interference is detected are limited even using the methods disclosed in PTL 1 and PTL 4, and frequency resolution in detecting frequency-selective interference decreases and detection accuracy deteriorates.

PTL 2 and PTL 3 make a hard decision on a demodulated signal for each data subcarrier for a symbol point at the shortest distance, integrate a difference value between the demodulated signal and the signal after the hard decision in the time direction for each subcarrier and thereby calculates the magnitude of variance obtained from the demodulated signal (reliability of subcarriers). However, according to PTL 2 and PTL 3, in an environment with a high level of noise, there is a high probability that wrong decisions may be made in making a hard decision and accuracy of detecting frequency-selective interference deteriorates.

According to PTL 5, since null data is newly multiplexed with a subcarrier together with data, the number of subcarriers to which data is assigned decreases and the transmission capacity decreases.

An object of the present disclosure is to provide a receiving apparatus and a frequency-selective interference correction method capable of correcting deterioration in reception performance due to the influence of frequency-selective interference caused by leakage power of an adjacent channel.

Solution to Problem

A receiving apparatus according to an aspect of the present disclosure includes: a receiving section that receives a signal including a short preamble and a data period time-multiplexed with the short preamble, the short preamble having a plurality of pilot subcarriers and a plurality of null subcarriers, the plurality of pilot subcarriers being mapped at predetermined frequency intervals in a transmission band; a null carrier extraction section that extracts signals of the plurality of null subcarriers from the received signal; a first interference detection section that detects respective interference levels of the plurality of subcarriers in the transmission band based on signal levels of the extracted plurality of null subcarriers; a soft decision section that makes a soft decision on a demodulated signal of the received data using reliability of the plurality of subcarriers calculated based on the detected interference levels; and an error correction section that performs error correction based on a result of the soft decision made by the soft decision section and that reconstructs data.

A frequency-selective interference correction method according to an aspect of the present disclosure is a method for a receiving apparatus that receives a signal transmitted from a transmitting apparatus using a transmission format including a short preamble and a data period, the short preamble including pilot subcarriers mapped at predetermined intervals in a transmission band, and a null subcarrier other than the pilot subcarriers in the transmission band, the method including: estimating an estimate value of a transmission path characteristic between the transmitting apparatus and the receiving apparatus using a received signal and determining reliability for each subcarrier in the transmission band based on the estimate value; detecting interference power in all subcarriers in the transmission band based on received power of the null subcarrier in the short preamble of the received signal; correcting the reliability according to the interference power; making a soft decision on a demodulated signal of the data out of the received signal based on the corrected reliability; and performing error correction based on a result of the soft decision.

Advantageous Effects of Invention

According to the present disclosure, it is possible to correct deterioration in reception performance due to the influence of frequency-selective interference caused by leakage power of an adjacent channel.

BRIEF DESCRIPTION OF DRAWINGS

FIG. 13 is a diagram provided for describing how frequency-selective interference is generated.

DESCRIPTION OF EMBODIMENTS

Hereinafter, embodiments of the present disclosure will be described in detail with reference to the accompanying drawings.

Figure 1:
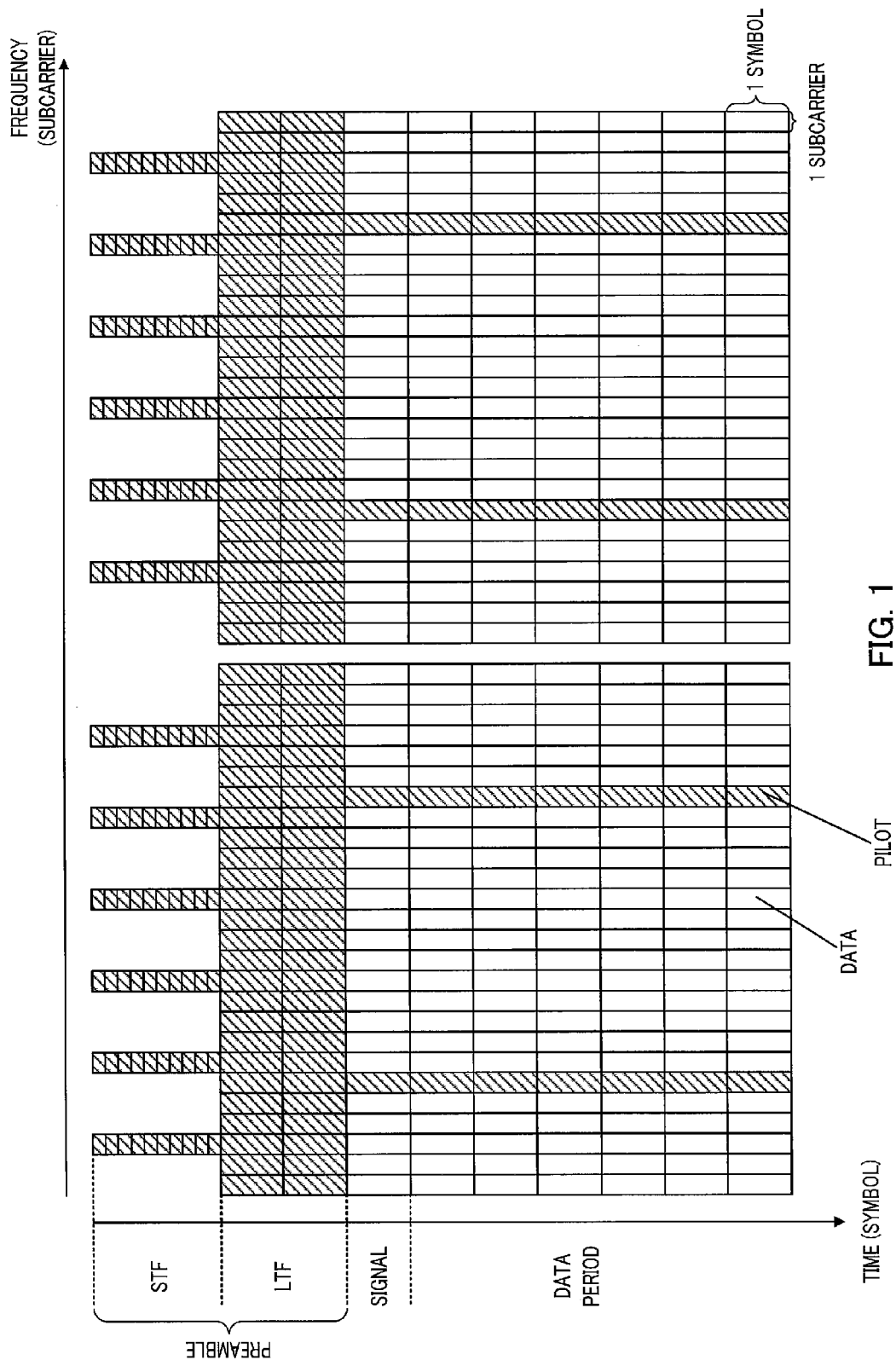
FIG. 1 is a diagram illustrating an example of a transmission format according to each embodiment of the present disclosure.

FIG. 1 illustrates an example of an OFDM transmission format for burst communication used in 802.11 or the like. In FIG. 1, the horizontal axis denotes a subcarrier direction corresponding to a frequency domain and the vertical axis represents a symbol direction corresponding to a time domain. In FIG. 1, hatched blocks denote resources having predetermined amplitudes and phases to which pilot signals known to transmitting and receiving sides are assigned and white blocks denote resources to which data is assigned.

The transmission format shown in FIG. 1 includes a preamble, SIGNAL and a data period. The preamble further includes STF and LTF. "STF (short preamble)" includes a plurality of pilot subcarriers and a plurality of null subcarriers mapped in a transmission band at predetermined frequency intervals. Pilot subcarriers are subcarriers to which pilot signals are assigned and mapped in the transmission band at predetermined intervals. Null subcarriers are subcarriers other than pilot subcarriers in the transmission band and not used for signal transmission. More specifically, the STF shown in FIG. 1 includes pilot signals multiplexed at 4-subcarrier intervals, each of which includes 10 continuous STSs (Short Training Symbols), each STS having ¼ time of an effective symbol length which corresponds to a time for two data symbols.

"LTF (long preamble)" includes pilot subcarriers to which pilot signals are assigned and continuously mapped in the transmission band. More specifically, the LTF shown in FIG. 1 includes pilot signals multiplexed with all subcarriers except DC (Direct-Current) component subcarriers in the center, and each LTF corresponds to a time for two data symbols. That is, the LTF has a plurality of pilot subcarriers consecutively mapped in the frequency direction and two subcarriers repeatedly mapped in the time direction. Note that although FIG. 1 illustrates an LTF in which two symbols are repeatedly mapped in the time direction, the LTF needs to have at least two symbols repeatedly mapped in the time direction and may have three or more symbols (e.g., four symbols).

In "SIGNAL," header information of a physical layer is multiplexed with a defined subcarrier and a pilot signal is multiplexed with a specific subcarrier. In the "data period," information data is multiplexed with a defined subcarrier and a pilot signal is multiplexed with a specific subcarrier. The data period includes a plurality of time-division-multiplexed symbols, each symbol being made up of a signal in which data is multiplexed with a plurality of subcarriers mapped at predetermined frequency intervals in the transmission band.

Embodiment 1

Figure 2:
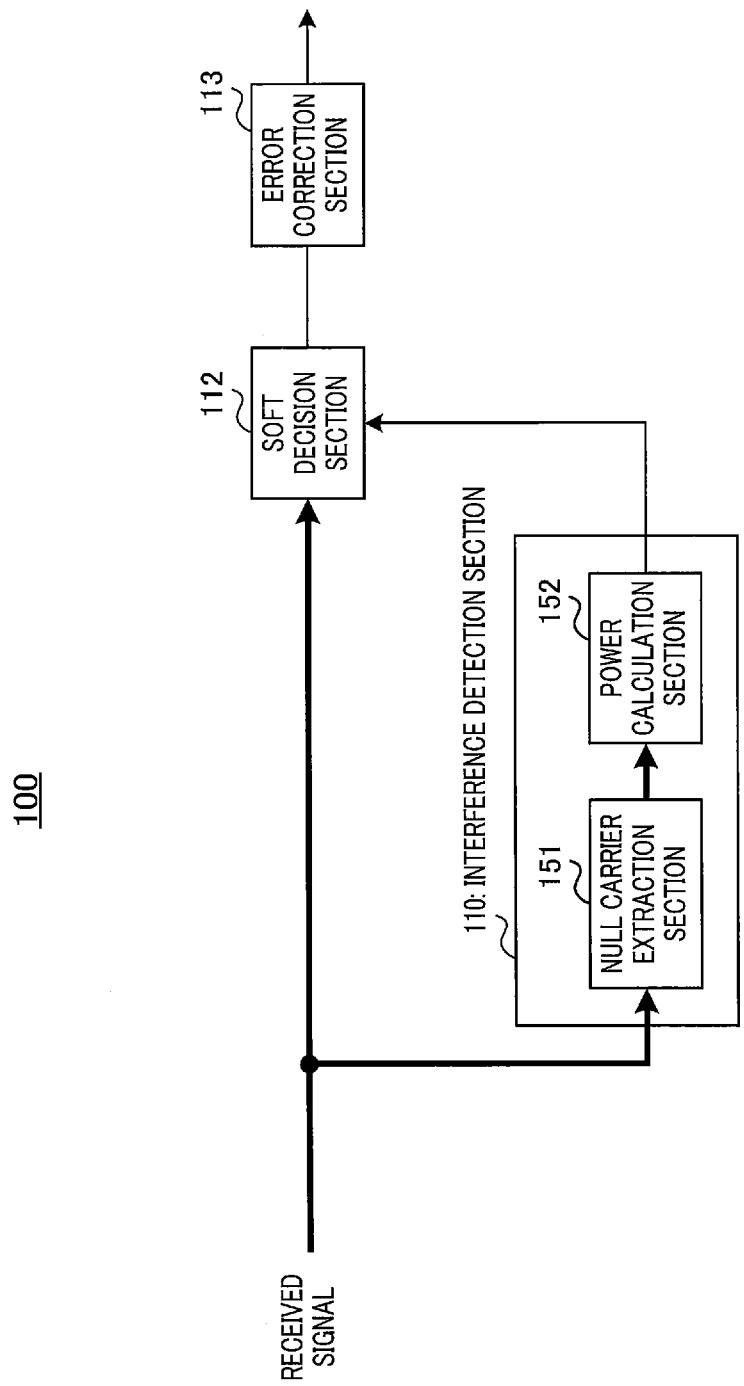
FIG. 2 is a block diagram illustrating a configuration of main parts of an OFDM receiving apparatus according to Embodiment 1 of the present disclosure.

FIG. 2 is a block diagram illustrating a configuration of main parts of OFDM receiving apparatus 100 according to the present embodiment. OFDM receiving apparatus 100 shown in FIG. 2 receives a signal including a short preamble (STF) having a plurality of pilot subcarriers and a plurality of null subcarriers mapped at predetermined frequency intervals in a transmission band, and a data period which is time multiplexed with the short preamble. Null carrier extraction section 151 in interference detection section 110 extracts signals of a plurality of null subcarrier frequencies from a received signal and power calculation section 152 detects each interference level of the plurality of subcarriers in the transmission band based on the extracted signal levels. Soft decision section 112 makes a soft decision on a demodulated signal of the received data using reliability of the plurality of subcarriers calculated based on the detected interference levels. Error correction section 113 performs error correction based on the soft decision result by soft decision section 112 and reconstructs data.

[Configuration of OFDM Receiving Apparatus 100]

Figure 3:
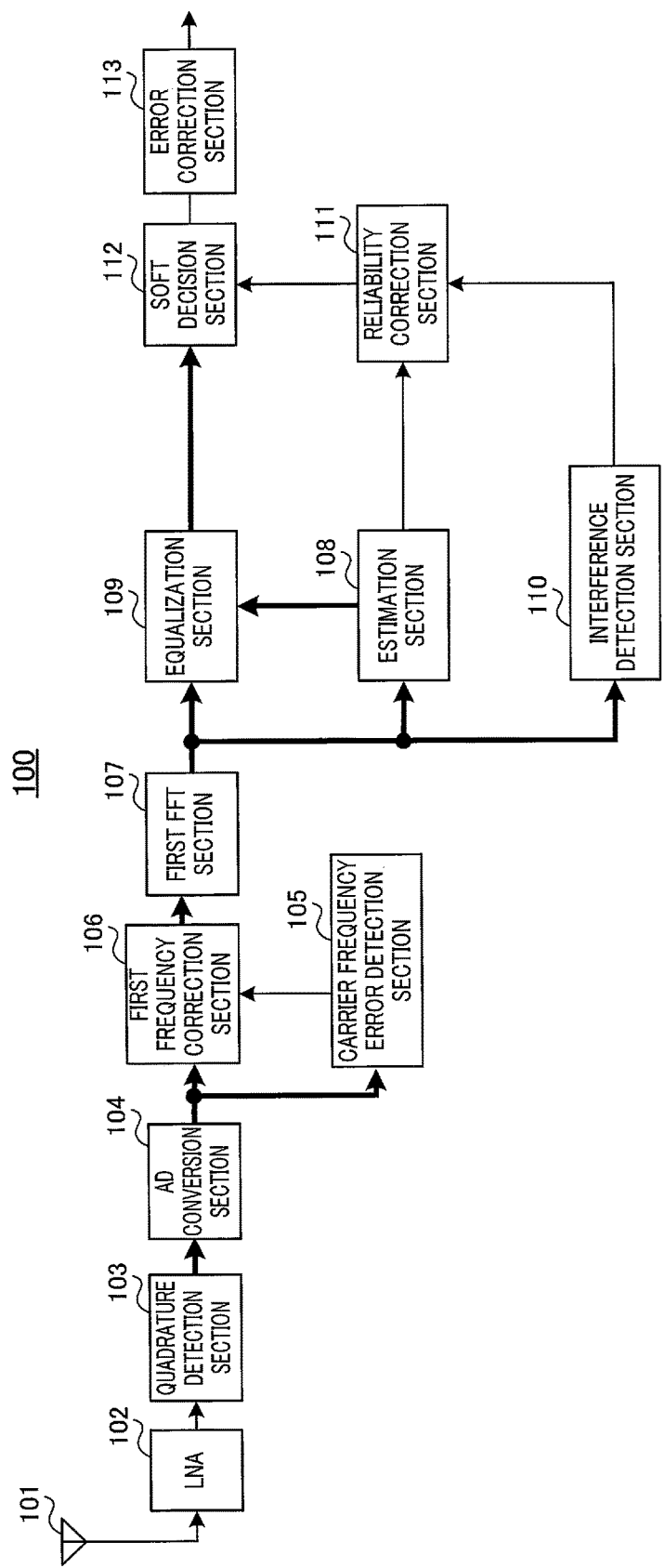
FIG. 3 is a block diagram illustrating a configuration of the OFDM receiving apparatus according to Embodiment 1 of the present disclosure.

FIG. 3 is a block diagram illustrating a configuration of OFDM receiving apparatus 100 according to the present embodiment. OFDM receiving apparatus 100 shown in FIG. 3 includes antenna 101, LNA (Low Noise Amplifier) 102, quadrature detection section 103, AD conversion section 104, carrier frequency error detection section 105, first frequency correction section 106, first FFT (Fast Fourier Transform) section 107, estimation section 108, equalization section 109, interference detection section 110, reliability correction section 111, soft decision section 112, and error correction section 113. Note that in FIG. 3, thin line arrows show real signals and thick line arrows show complex signals.

LNA 102 receives a signal transmitted from an OFDM transmitting apparatus (not shown) via antenna 101 using an OFDM transmission format (e.g., see FIG. 1), applies amplification at a predetermined level to the received signal and outputs the amplified signal to quadrature detection section 103.

Quadrature detection section 103 performs quadrature-coherent detection on the signal received from LNA 102 at a predetermined frequency and outputs an OFDM signal mapped on a desired reception channel as a complex baseband signal (analog signal) to AD conversion section 104.

AD conversion section 104 converts the complex baseband signal (analog signal) received from quadrature detection section 103 to a digital signal and outputs the complex baseband signal which has been converted to a digital value to carrier frequency error detection section 105 and first frequency correction section 106.

Carrier frequency error detection section 105 detects a carrier frequency error of the complex baseband signal using STF or LTF signals in the OFDM transmission format (see FIG. 1) of the complex baseband signal received from AD conversion section 104. Carrier frequency error detection section 105 outputs the detected carrier frequency error to first frequency correction section 106.

First frequency correction section 106 applies carrier frequency correction to the complex baseband signal received from AD conversion section 104 based on the carrier frequency error received from carrier frequency error detection section 105 and outputs the corrected complex baseband signal to first FFT section 107.

First FFT section 107 applies Fourier transform from a time domain to a frequency domain to the signal obtained by extracting a portion corresponding to an effective OFDM symbol period at a predetermined window position of the complex baseband signal received from first frequency correction section 106. First FFT section 107 outputs the Fourier transformed signal to estimation section 108, equalization section 109 and interference detection section 110 as a frequency domain OFDM signal.

Estimation section 108 estimates for each subcarrier, characteristics of amplitude and phase distortion (transmission path characteristics between an OFDM transmitting apparatus and OFDM receiving apparatus 100) that affects the received signal in the transmission path using the frequency domain OFDM signal received from first FFT section 107. For example, estimation section 108 estimates the transmission path characteristic using pilot signals in LTF of the frequency domain OFDM signal. Estimation section 108 outputs the estimated distortion characteristics to equalization section 109 as a transmission path characteristic estimate value. Estimation section 108 further calculates signal power of each subcarrier in the transmission band using the transmission path characteristic estimate value and outputs the calculated power to reliability correction section 111. The calculated power corresponds to reliability of the corresponding subcarrier. That is, the greater the power (transmission path characteristic estimate value), the higher the reliability of the corresponding subcarrier.

Equalization section 109 applies amplitude and phase correction (equalization) to a data signal included in the data period of the frequency domain OFDM signal received from first FFT section 107 using the transmission path characteristic estimate value received from estimation section 108 and outputs the corrected signal to soft decision section 112 as the demodulated data signal.

Interference detection section 110 detects a subcarrier affected by frequency-selective interference using the STF of the frequency OFDM signal received from first FFT section 107. More specifically, interference detection section 110 detects the interference level of each of a plurality of subcarriers in the transmission band (e.g., interference power from the adjacent channel) based on a signal level of the null subcarrier frequency in the STF (e.g., received power (null subcarrier power)). Interference detection section 110 outputs the interference power corresponding to all subcarriers to reliability correction section 111. Details of the method of detecting frequency-selective interference by interference detection section 110 will be described later.

Reliability correction section 111 applies reliability correction to the power of the transmission path characteristic estimate value (that is, reliability) received from estimation section 108 according to the interference level (interference power) received from interference detection section 110. Reliability correction section 111 outputs the correction result to soft decision section 112 as the corrected reliability. Here, as a condition, the reliability is proportional to the power of the transmission path characteristic estimate value; the greater the power of the transmission path characteristic estimate value, the higher the reliability. The reliability is inversely proportional to the interference power; the greater the interference power, the lower the reliability. That is, reliability correction section 111 corrects the reliability such that the reliability decreases as the interference power increases. For example, a reliability correction expression is expressed by $|H_k|^2/|I_k|^2$. Here, $|H_k|^2$ denotes power of the transmission path characteristic estimate value, $|I_k|^2$ denotes interference power and k denotes a subcarrier number. Note that the above-described correction expression may be logarithmically expressed and the correction expression is not limited to this as long as the aforementioned condition of reliability is satisfied.

Soft decision section 112 makes a soft decision on the demodulated data signal received from equalization section 109 based on the reliability of each subcarrier received from reliability correction section 111 (that is, corrected reliability).

Figure 4:
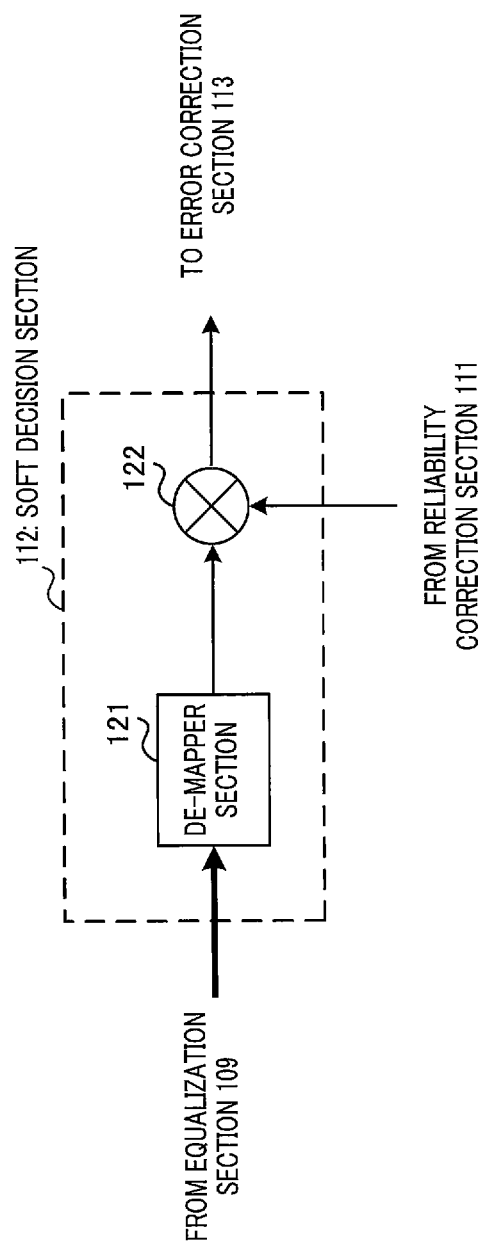
FIG. 4 is a block diagram illustrating an internal configuration of a soft decision section according to Embodiment 1 of the present disclosure.

FIG. 4 is a block diagram illustrating an internal configuration of soft decision section 112. Soft decision section 112 includes de-mapper section 121 and multiplier 122. De-mapper section 121 applies a bitwise soft decision to the demodulated data signal based on multivalue mapping and outputs the soft decision result to multiplier 122 as the soft decision data signal. Multiplier 122 multiplies the soft decision data signal received from de-mapper section 121 by the reliability received from reliability correction section 111. Through this multiplication processing, the soft decision data signal (soft decision value) is increased for subcarriers with high reliability and likelihood of data is thereby increased. On the other hand, the soft decision data signal (soft decision value) is decreased for subcarriers with low reliability and likelihood of data is thereby decreased. For example, for the soft decision value of a certain bit, if a maximum likelihood equal to "1" is referred to "A" and a maximum likelihood equal to "0" is referred to "−A," a likelihood neither equal to "1" nor "0" is referred to as "0." That is, multiplier 122 performs weighting on the soft decision value. Multiplier 122 outputs the multiplication result (weighted soft decision value) to error correction section 113.

Error correction section 113 performs error correction according to the likelihood of soft decision values received from soft decision section 112 and reconstructs information data.

[Operation of Interference Detection Section 110]

Details of the method of detecting frequency-selective interference by interference detection section 110 of OFDM receiving apparatus 100 shown in FIG. 3 will be described.

Figure 5:
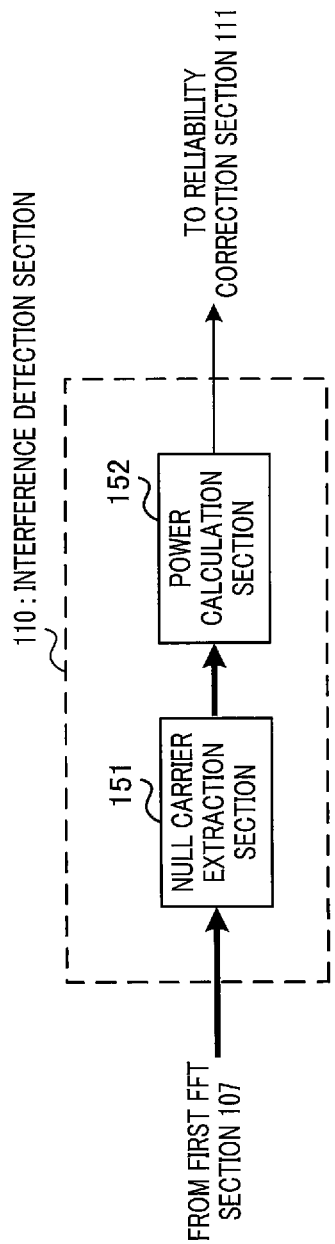
FIG. 5 is a block diagram illustrating an internal configuration of an interference detection section according to Embodiment 1 of the present disclosure.

FIG. 5 is a block diagram illustrating an internal configuration of interference detection section 110. Interference detection section 110 shown in FIG. 5 includes null carrier extraction section 151 and power calculation section 152. Power calculation section 152 corresponds to the first interference detection section.

Figure 6:
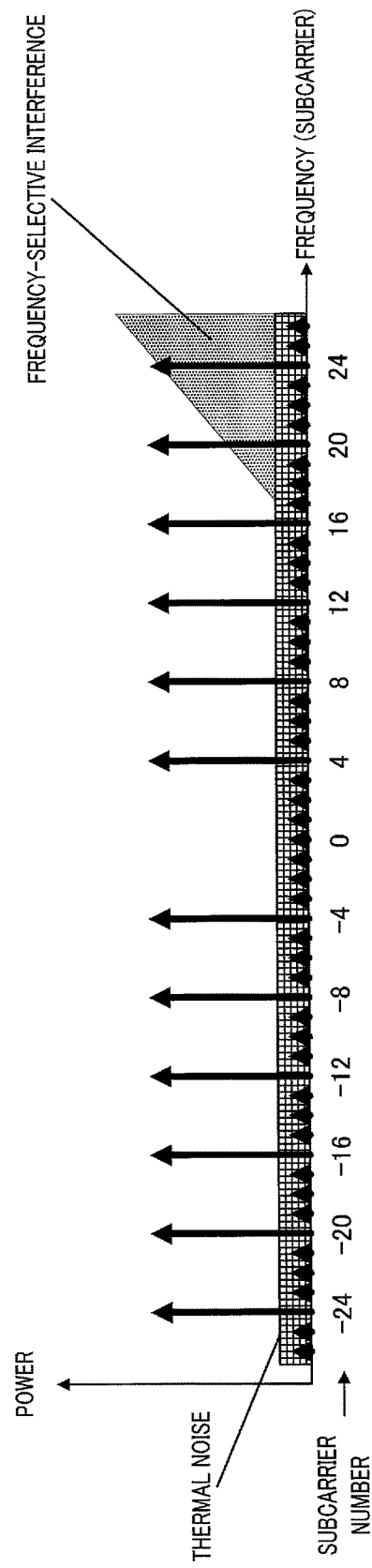
FIG. 6 is a diagram illustrating received power of subcarriers in an STF according to Embodiment 1 of the present disclosure.

FIG. 6 is a diagram illustrating an example of received power of subcarriers in the STF. In FIG. 6, the horizontal axis represents the frequency (subcarrier) and the vertical axis represents the power.

Null carrier extraction section 151 extracts signals of null subcarrier frequencies in the STF (see FIG. 1) of the frequency domain OFDM signal received from first FFT section 107 and outputs the extracted signals to power calculation section 152. For example, in FIG. 6, subcarriers with subcarrier numbers of −24, −20, −16, −12, −8, −4, 4, 8, 12, 16, 20 and 24 (that is, subcarriers at 4-subcarrier intervals) are pilot subcarriers. Null carrier extraction section 151 assumes a frequency with a subcarrier number other than the above-described pilot subcarriers as a null subcarrier frequency and extracts a signal of null subcarrier frequency.

Power calculation section 152 calculates received power from the signal of null subcarrier frequency received from null carrier extraction section 151 and outputs the calculated received power to reliability correction section 111 as interference power.

For example, as shown in FIG. 6, in the STF under a frequency-selective interference environment, it is apparent that received power of a null subcarrier frequency is made up of thermal noise power having constant power throughout all subcarriers and power (interference power) of a frequency-selective interference signal (interference signal from an adjacent channel). That is, the received power of null subcarrier frequency fluctuates depending on the magnitude of frequency-selective interference. That is, interference detection section 110 (power calculation section 152) calculates received power of a null subcarrier frequency and can thereby estimate interference power at the null subcarrier frequency.

Furthermore, power calculation section 152 may interpolate interference power at pilot subcarrier frequencies using, for example, interference power at a null subcarrier frequency. That is, power calculation section 152 presumably detects interference levels of a plurality of pilot subcarrier frequencies included in the STF based on signal levels of a plurality of null subcarrier frequencies. By so doing, power calculation section 152 can calculate interference levels corresponding to all subcarriers.

As a method of calculating power in power calculation section 152, it may be possible to calculate, for example, the sum of the squares of a real number and the squares of an imaginary number of a complex signal. As an interpolation method in power calculation section 152, it may be possible to use, for example, average power of null subcarrier frequencies adjacent to both ends of a pilot subcarrier frequency or use power at one of the both ends. When calculating interference power, power calculation section 152 preferably assumes a value obtained by subtracting thermal noise power from the calculated power to be the interference power. For example, power calculation section 152 may assume the least power calculation result of power calculation results of respective null subcarrier frequencies to be a typical value of thermal noise power or assume a value obtained by dividing the sum of power of null subcarrier frequencies by the total number of subcarriers, and then multiplying the division result by a coefficient smaller than 1, to be a typical value of the thermal noise power. Power calculation section 152 may subtract the typical value of the thermal noise power from the power of each null subcarrier frequency.

As described above, OFDM receiving apparatus 100 estimates interference power for each subcarrier from received power of null subcarrier frequencies in the STF, and can thereby detect a subcarrier affected by frequency-selective interference. Here, as shown in FIG. 1 or FIG. 6, null subcarriers in the STF are subcarriers other than pilot subcarriers mapped at 4-subcarrier intervals. Thus, OFDM receiving apparatus 100 can estimate interference power using three out of four consecutive subcarriers. That is, OFDM receiving apparatus 100 has higher frequency resolution in detecting frequency-selective interference, and can detect frequency-selective interference with higher accuracy. The present embodiment can thereby correct deterioration in reception performance due to the influence of frequency-selective interference caused by leakage power of adjacent channels or the like.

According to the present embodiment, OFDM receiving apparatus 100 estimates interference power based on received power of a null subcarrier frequency. In this way, even in an environment with a high level of noise, it is not necessary to perform processing affected by the magnitude of noise such as a hard decision on data subcarriers and it is possible to detect frequency-selective interference in a null subcarrier with high accuracy.

Moreover, according to the present embodiment, OFDM receiving apparatus 100 estimates interference power using a null subcarrier (that is, a subcarrier to which no signal is assigned) in the STF including a pilot subcarrier and a null subcarrier. By so doing, it is possible to correct frequency-selective interference without reducing the number of subcarriers to which data is assigned, that is, without reducing a transmission capacity.

Embodiment 2

A case has been described in Embodiment 1 where interference power at a null subcarrier is estimated. In contrast, a case will be described in the present embodiment where interference power at a pilot subcarrier and a data subcarrier in addition to a null subcarrier is estimated.

Figure 7:
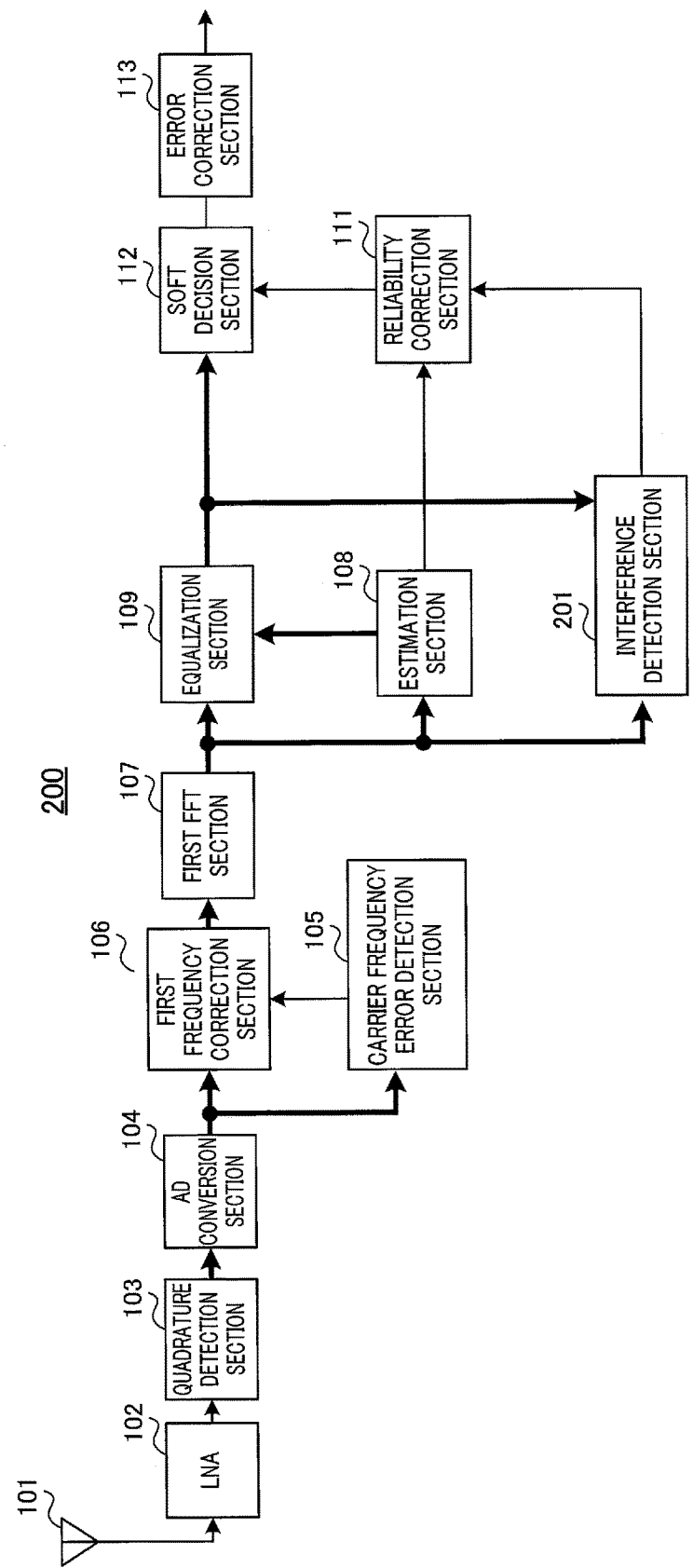
FIG. 7 is a block diagram illustrating a configuration of an OFDM receiving apparatus according to Embodiment 2 of the present disclosure.

FIG. 7 is a block diagram illustrating a configuration of OFDM receiving apparatus 200 according to the present embodiment. Note that in FIG. 7, the same elements as those in Embodiment 1 (FIG. 3) are assigned the same reference numerals and any duplicate description of the elements is omitted. More specifically, FIG. 7 is different from FIG. 3 in that interference detection section 201 is used instead of interference detection section 110.

Interference detection section 201 detects a subcarrier affected by frequency-selective interference using signals in the "STF" and "LTF" of a frequency OFDM signal received from first FFT section 107. Interference detection section 201 also detects a subcarrier affected by frequency-selective interference using a signal in "SIGNAL" or "data" of the frequency OFDM signal received from equalization section 109.

Figure 8:
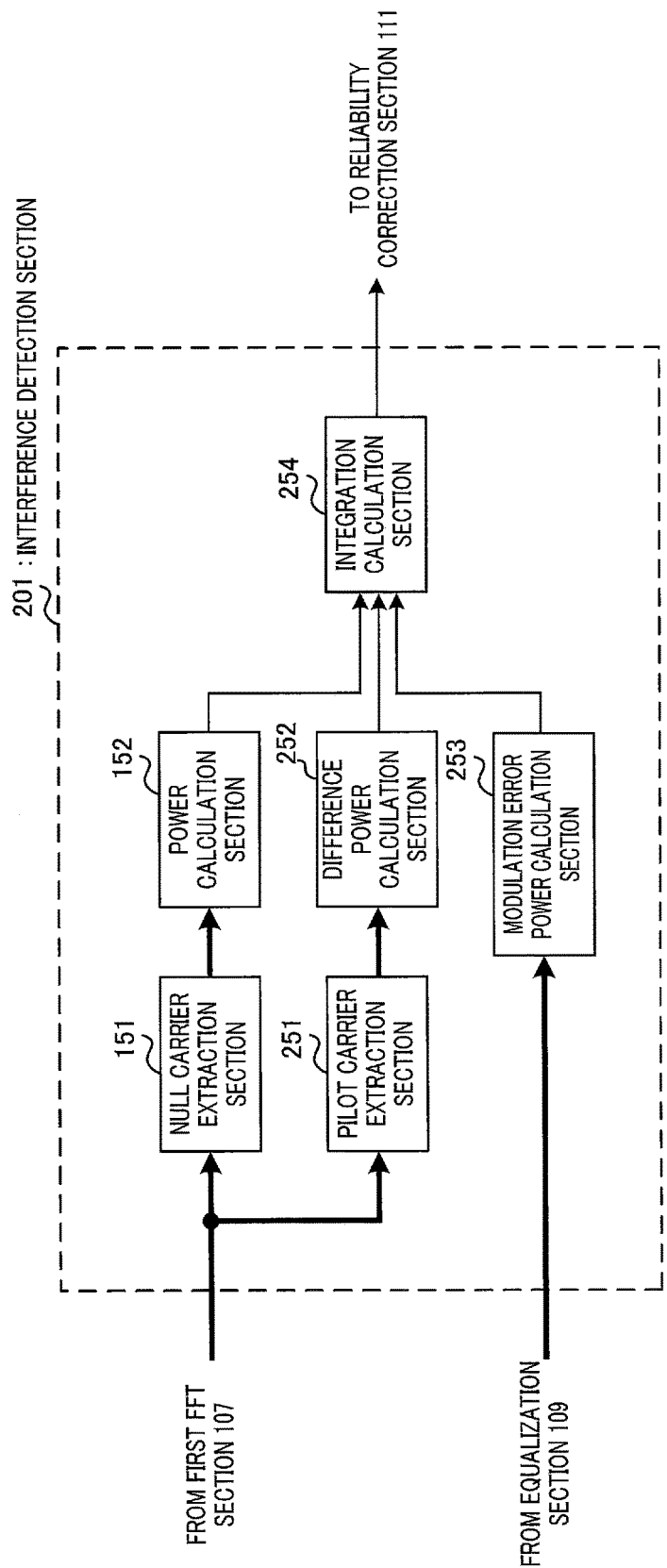
FIG. 8 is a block diagram illustrating an internal configuration of an interference detection section according to Embodiment 2 of the present disclosure.

FIG. 8 is a block diagram illustrating an internal configuration of interference detection section 201. In FIG. 8, the same elements as those in Embodiment 1 (FIG. 5) are assigned the same reference numerals and any duplicate description of the elements is omitted. More specifically, interference detection section 201 shown in FIG. 8 adopts a configuration with pilot carrier extraction section 251, difference power calculation section 252, modulation error power calculation section 253 and integration calculation section 254 newly added to interference detection section 110. That is, difference power calculation section 252 corresponds to the second interference detection section and modulation error power calculation section 253 corresponds to the third interference detection section.

Pilot carrier extraction section 251 extracts signals of pilot subcarrier frequencies (pilot signals) in the LTF (see FIG. 1) of a frequency domain OFDM signal received from first FFT section 107 and calculates a transmission path characteristic estimate value for each pilot subcarrier using the pilot signals. Pilot carrier extraction section 251 outputs the transmission path characteristic estimate values to difference power calculation section 252.

Difference power calculation section 252 detects an interference level of each of a plurality of subcarriers in the transmission band based on an inter-symbol difference (difference between two signals repeated in the time direction in FIG. 1) of signals of the plurality of pilot subcarrier frequencies extracted by pilot carrier extraction section 251. For example, difference power calculation section 252 calculates difference power between symbols (e.g., 2 symbols in the LTF shown in FIG. 1) of the transmission path characteristic estimate value received from pilot carrier extraction section 251 and outputs the difference power to integration calculation section 254. That is, difference power calculation section 252 calculates interference power based on a time variation of the transmission path characteristic estimate value in a pilot subcarrier.

Modulation error power calculation section 253 makes a hard decision on the demodulated data signal of the data period received from equalization section 109 and detects interference levels of a plurality of subcarriers in the transmission band based on errors from the hard decision result of the demodulated data signals. For example, modulation error power calculation section 253 makes a hard decision on the demodulated data signal of each subcarrier received from equalization section 109 into a constellation at the time of modulation and calculates a difference (error power) between the hard decision value and the demodulated data signal in the constellation. More specifically, modulation error power calculation section 253 calculates error power based on a difference between a symbol point (signal point) in the constellation (hard decision result) and a symbol point of the demodulated data signal. Modulation error power calculation section 253 outputs the calculated error power to integration calculation section 254. That is, modulation error power calculation section 253 calculates interference power based on the error power in the demodulated data signal (data subcarrier).

Integration calculation section 254 time-integrates the values received from power calculation section 152, difference power calculation section 252 and modulation error power calculation section 253 in the symbol direction for each subcarrier and thereby obtains interference power for each subcarrier. Integration calculation section 254 outputs the interference power obtained to reliability correction section 111. For example, integration calculation section 254 selects the output of power calculation section 152 when receiving an STF signal, selects the output of difference power calculation section 252 when receiving an LTF signal, and selects the output of modulation error power calculation section 253 when receiving a signal of SIGNAL or the data period.

That is, soft decision section 112 makes a soft decision using reliability of each subcarrier calculated based on the interference levels detected by the first interference detection section (power calculation section 152), the second interference detection section (difference power calculation section 252) or the third interference detection section (modulation error power calculation section 253).

As described above, in the present embodiment, OFDM receiving apparatus 200 estimates interference power using not only a null subcarrier but also a pilot subcarrier and data subcarrier and performs smoothing operation of interference power in the symbol direction (time domain) for each subcarrier. By so doing, it is possible to improve estimation accuracy of interference power for each subcarrier and further correct deterioration in reception performance due to the influence of frequency-selective interference caused by leakage power of an adjacent channel or the like compared to Embodiment 1.

A configuration using both a pilot subcarrier and a data subcarrier in addition to a null subcarrier has been described in the present embodiment, but a configuration may also be used which uses one of a pilot subcarrier (pilot carrier extraction section 251, difference power calculation section 252) and a data subcarrier (modulation error power calculation section 253).

In the present embodiment, in an environment including such a high level of noise that an error occurs in a hard decision result of a data subcarrier, processing of integration calculation section 254 may be stopped so as to prevent the output of modulation error power calculation section 253 from being used as interference power. By so doing, it is possible to reduce deterioration of estimation accuracy of interference power. For example, interference detection section 201 may integrate the output of modulation error power calculation section 253 throughout all the subcarriers, determine, when an integral value exceeds a predetermined threshold, that the transmission path environment is so poor that an error occurs in a hard decision result and stop processing of integration calculation section 254.

In order to assume the output of integration calculation section 254 as interference power, it is desirable that thermal noise power be subtracted from the integral value (power calculation result). For example, integration calculation section 254 may assume the least power calculation result of power calculation results of the respective subcarriers as a representative value of thermal noise power or may assume a value obtained by dividing the sum total of power of the respective subcarriers by the total number of subcarriers, and then multiplying the division result by a coefficient smaller than 1, as a representative value of thermal noise power. Integration calculation section 254 may assume a value obtained by subtracting the representative value of thermal noise power from power of each subcarrier as interference power.

Embodiment 3

Figure 9:
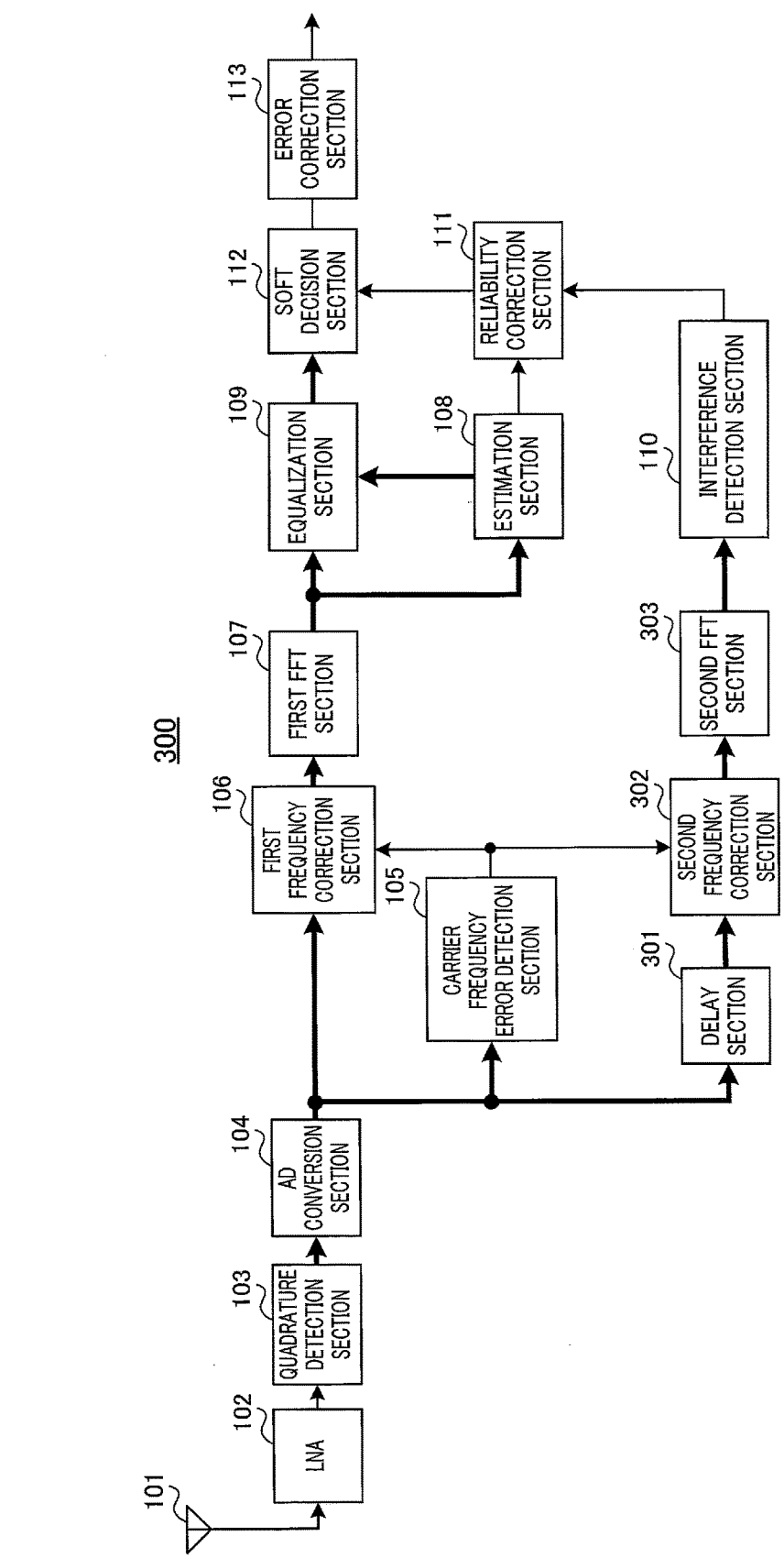
FIG. 9 is a block diagram illustrating a configuration of an OFDM receiving apparatus according to Embodiment 3 of the present disclosure.

FIG. 9 is a block diagram illustrating a configuration of OFDM receiving apparatus 300 of the present embodiment. In FIG. 9, the same elements as those in Embodiment 1 (FIG. 3) are assigned the same reference numerals and any duplicate description of the elements is omitted. More specifically, OFDM receiving apparatus 300 shown in FIG. 9 is different from OFDM receiving apparatus 100 shown in FIG. 3 in that delay section 301, second frequency correction section 302 and second FFT section 303 are added. In FIG. 9, unlike Embodiment 1, interference detection section 110 uses the output of second FFT section 303 instead of the output of first FFT section 107.

Delay section 301 causes a complex baseband signal received from AD conversion section 104 to delay by a time corresponding to the STF and outputs the delayed complex baseband signal to second frequency correction section 302.

Second frequency correction section 302 applies carrier frequency correction to the complex baseband signal received from delay section 301, based on a carrier frequency error received from carrier frequency error detection section 105. More specifically, second frequency correction section 302 applies coarsely adjusted AFC to the STF signal using the carrier frequency error detected using the STF. Second frequency correction section 302 outputs the corrected complex baseband signal to second FFT section 303.

Second FFT section 303 extracts a portion of the complex baseband signal received from second frequency correction section 302 corresponding to an effective OFDM symbol period of a predetermined window position and applies Fourier transform to the resultant signal to transform the signal from a time domain to a frequency domain. Second FFT section 303 outputs the signal subjected to Fourier transform to interference detection section 110 as a frequency domain OFDM signal.

That is, OFDM receiving apparatus 300 also applies, to the STF itself, frequency correction using the carrier frequency error detected using the STF. In this way, the frequency domain OFDM signal received by interference detection section 110 is free of any carrier frequency errors in the STF signal. Thus, interference detection section 110 can estimate interference power using the STF (signal of frequency-corrected STF) with no carrier frequency error. That is, it is possible to further improve the estimation accuracy of interference power.

Thus, according to the present embodiment, it is possible to further correct deterioration in reception performance due to the influence of frequency-selective interference caused by leakage power of an adjacent channel or the like compared to Embodiment 1.

Embodiment 4

Figure 10:
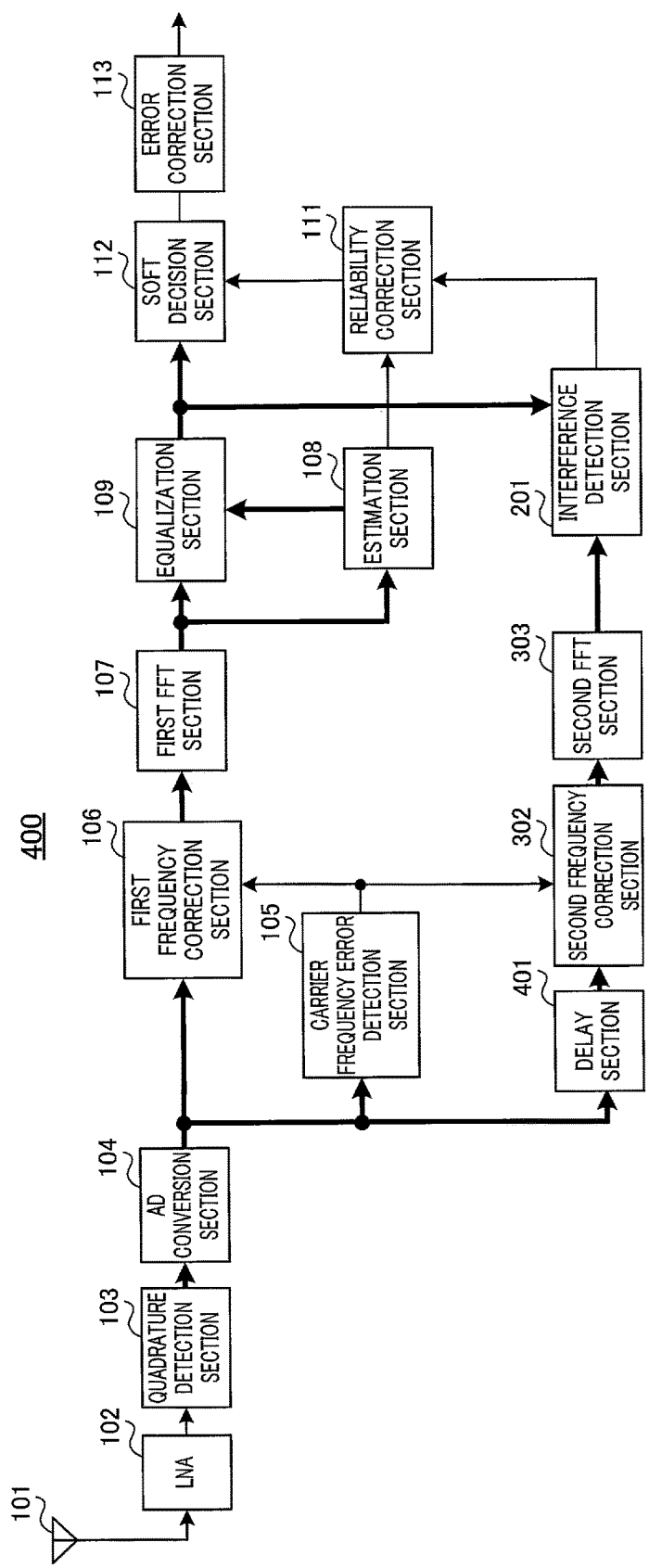
FIG. 10 is a block diagram illustrating an OFDM receiving apparatus according to Embodiment 4 of the present disclosure.

FIG. 10 is a block diagram illustrating a configuration of OFDM receiving apparatus 400 of the present embodiment. In FIG. 10, in the embodiment, the same elements as those in Embodiment 2 (FIG. 7) or Embodiment 3 (FIG. 9) are assigned the same reference numerals and any duplicate description of the elements is omitted. More specifically, FIG. 10 is different in that delay section 401 is used instead of delay section 301 in FIG. 9 and interference detection section 201 in Embodiment 2 (FIG. 7) is used instead of interference detection section 110 in FIG. 9.

Delay section 401 causes a complex baseband signal received from AD conversion section 104 to delay by a time corresponding to a preamble (STF and LTF) and outputs the delayed complex baseband signal to second frequency correction section 302.

That is, OFDM receiving apparatus 400 applies, to the STF and LTF themselves, frequency correction using a carrier frequency error detected using the STF and LTF. More specifically, coarsely adjusted AFC is applied to the STF and fine adjustment AFC is applied to the LTF. As a result, carrier frequency errors are eliminated from both signals of the STF and LTF in the frequency domain OFDM signal received by interference detection section 201. This allows interference detection section 201 (at least one of power calculation section 152 and difference power calculation section 252) to estimate interference power using the STF and LTF free of any carrier frequency errors. That is, accuracy of estimation of interference power can be improved.

The present embodiment can further correct deterioration in reception performance due to the influence of frequency-selective interference caused by leakage power of adjacent channels or the like compared to Embodiment 2.

Embodiment 5

In order to satisfy the required specification in TGah (802.11ah), plans of technological changes from the conventional wireless LAN standards are proposed from various companies. Above all, it is believed that a more robust transmission scheme than a transmission scheme with highest transmission error resistance used for the conventional wireless LAN (BPSK modulation/error correction (convolutional code) coding rate 1/2) (robust transmission scheme) is necessary to secure a transmission distance of 1 km with low power output. For this reason, in TGah, examples of the effective method for increasing robustness include a method of assigning the same data to two or more subcarriers and repeatedly transmitting the data (e.g., see NPL 1).

Figure 11:
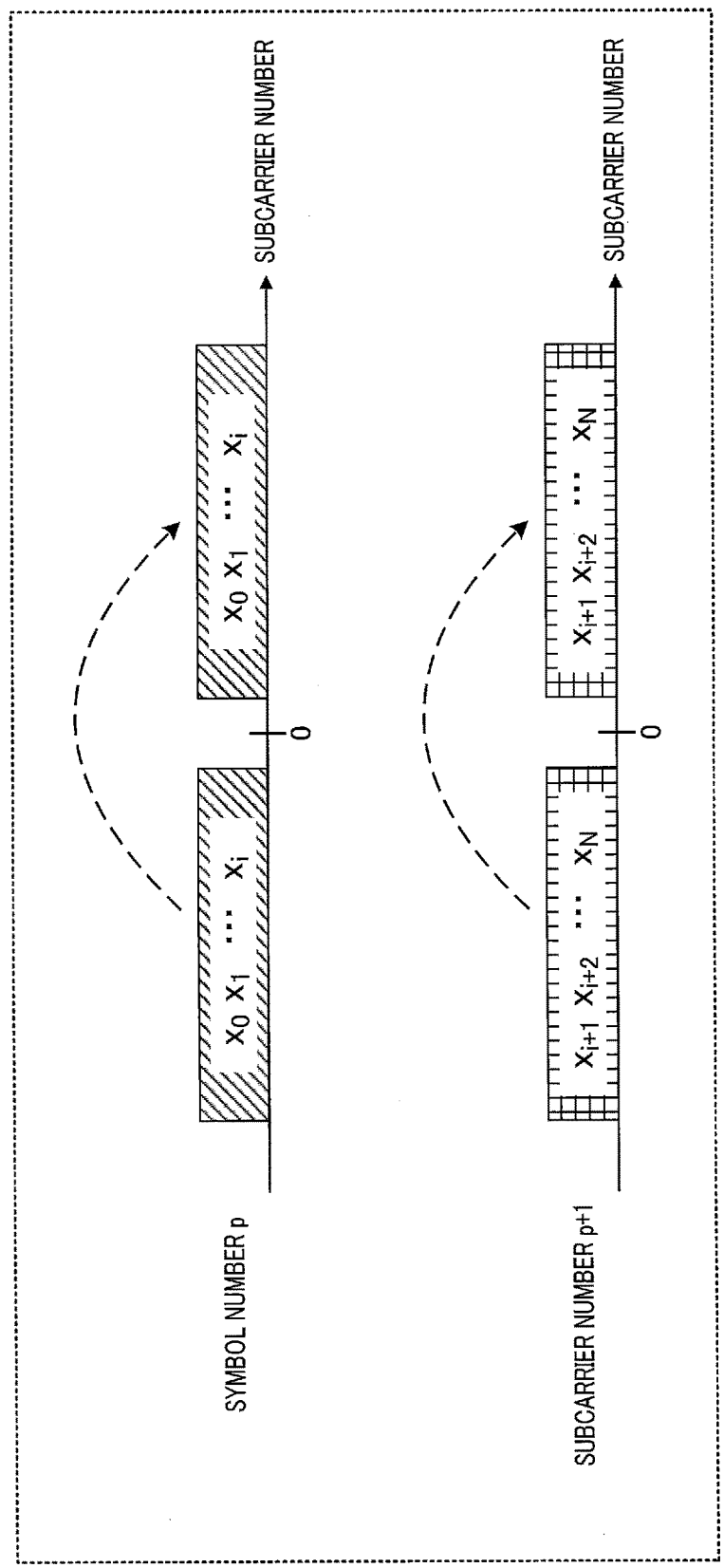
FIG. 11 is a diagram illustrating an example of a repetition transmission scheme.

FIG. 11 illustrates an example of the repetition transmission method. As shown in FIG. 11, symbol number p and symbol number p+1 are independent of each other. Within the same symbol, the same data is assigned to different subcarriers. In FIG. 11, a data group ($x_0$, $x_1$, . . . , $x_i$ with symbol number p and $x_{i+1}$, $x_{i+2}$, . . . , $x_N$ with symbol number p+1) on the positive side (subcarrier numbers greater than 0) of subcarrier numbers is also mapped on the negative side (subcarrier numbers smaller than 0). That is, the same data is transmitted twice repeatedly. Thus, on the receiving side, it is possible to obtain a power gain of 3 dB (double) and improve the robustness by performing combined decoding on the same data transmitted using different subcarriers. In this way, in FIG. 11, since the same data is assigned to different subcarriers, even when, for example, specific subcarriers are lost due to the presence of multipath interference and it is difficult to decode data on the receiving side, unless the same data is lost at the position at which the data is assigned to another subcarrier, the receiving side can perform demodulation using the data assigned to the subcarrier. That is, the frequency diversity effect can be achieved.

However, performing combined decoding that simply takes into account the influence of multipath interference as in the case of the aforementioned repetition transmission method, it is not possible to eliminate the influence of frequency-selective interference and there is a high possibility that deterioration of reception characteristics may be caused under an environment with frequency-selective interference. Thus, the present embodiment will describe a method of reducing the influence of frequency-selective interference when a repetition transmission method is used.

Figure 12:
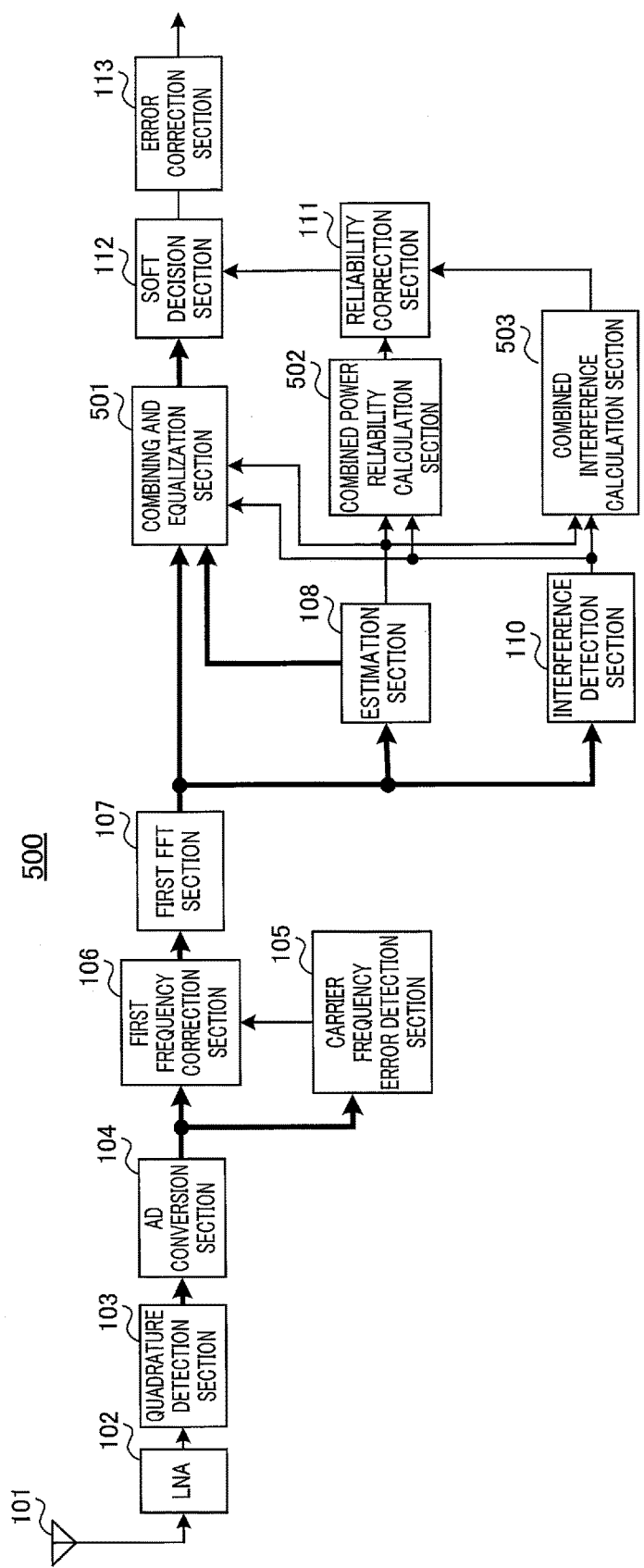
FIG. 12 is a block diagram illustrating a configuration of an OFDM receiving apparatus according to Embodiment 5 of the present disclosure.

FIG. 12 is a block diagram illustrating a configuration of OFDM receiving apparatus 500 of the present embodiment. Note that in FIG. 12 the same elements as those in Embodiment 1 (FIG. 3) are assigned the same reference numerals and any duplicate description of the elements is omitted. More specifically, FIG. 12 is different in that combining and equalization section 501 is used instead of equalization section 109 in FIG. 3. Furthermore, OFDM receiving apparatus 500 shown in FIG. 12 is newly provided with combined power reliability calculation section 502 and combined interference calculation section 503 compared to OFDM receiving apparatus 100 shown in FIG. 3.

Combining and equalization section 501 performs combining and equalization processing on the same data assigned to a plurality of subcarriers using frequency domain OFDM signal Y received from first FFT section 107, transmission path characteristic estimate value H and power $|H|^2$ of a transmission path characteristic estimate value received from estimation section 108 and interference power $|I|^2$ received from interference detection section 110, and obtains demodulated data signal X^. That is, combining and equalization section 501 performs combining and equalization processing on the data assigned to the above-described two or more subcarriers using the interference level detected in the two or more subcarriers to which the same data is assigned and the transmission path characteristic estimation result. For example, combining and equalization section 501 performs combining and equalization processing according to equation 1 and obtains demodulated data signal X^. Combining and equalization section 501 outputs demodulated data signal X^ to soft decision section 112.

[1]

$$\hat{X}_k = \frac{Y_{k,p} \cdot H^*_{k,p} / |I_{k,p}|^2 + Y_{k-(cnum+1),p} \cdot H^*_{k-(cnum+1),p} / |I_{k-(cnum+1),p}|^2}{|H_{k,p}|^2 / |I_{k,p}|^2 + |H_{k-(cnum+1),p}|^2 / |I_{k-(cnum+1),p}|^2}$$ (Equation 1)

In equation 1, k represents a subcarrier number, p represents a symbol number and cnum represents a maximum value of a subcarrier number.

Combined power reliability calculation section 502 combines power $|H|^2$ (that is, reliability) for the same data assigned to a plurality of subcarriers using power $|H|^2$ of the transmission path characteristic estimate value received from estimation section 108 and interference power $|I|^2$ received from interference detection section 110 and obtains combined power $\hat{H}$. That is, combined power reliability calculation section 502 calculates combined reliability for the data assigned to the above-described two or more subcarriers using the interference levels detected in the two or more subcarriers to which the same data is assigned and the transmission path characteristic estimation result. For example, combined power reliability calculation section 502 performs combining processing according to equation 2 and outputs the combining result to reliability correction section 111 as combined power $\hat{H}$ of the transmission path characteristic estimate value.

[2]

$$\hat{H}_k = \frac{|H_{k,p}|^4/|I_{k,p}|^2 + |H_{k-(cnum+1),p}|^4/|I_{k-(cnum+1),p}|^2}{|H_{k,p}|^2/|I_{k,p}|^2 + |H_{k-(cnum+1),p}|^2/|I_{k-(cnum+1),p}|^2} \quad \text{(Equation 2)}$$

Combined interference calculation section 503 combines interference power $|I|^2$ for the same data assigned to a plurality of subcarriers using power $|H|^2$ of the transmission path characteristic estimate value received from estimation section 108 and interference power $|I|^2$ received from interference detection section 110, and obtains interference combined power $\hat{I}$. That is, combined interference calculation section 503 calculates a combined interference level of the two or more subcarriers using the interference levels detected at the two or more subcarriers to which the same data is assigned and the transmission path characteristic estimation result. For example, combined interference calculation section 503 performs combining processing according to equation 3 and outputs the combining result to reliability correction section 111 as interference combined power $\hat{I}$.

[3]

$$\hat{I}_k = \frac{|H_{k,p}|^2 + |H_{k-(cnum+1),p}|^2}{|H_{k,p}|^2/|I_{k,p}|^2 + |H_{k-(cnum+1),p}|^2/|I_{k-(cnum+1),p}|^2} \quad \text{(Equation 3)}$$

Reliability correction section 111 applies reliability correction to combined power $\hat{H}$ for each piece of data using the combined interference power (combined interference level) $\hat{I}$ for each piece of data. Soft decision section 112 makes a soft decision on the demodulated data signal (demodulated data signal after combining and equalization processing) $\hat{X}$ received from combining and equalization section 501 based on the reliability (integrated reliability) for each piece of data received from reliability correction section 111. That is, soft decision section 112 makes a soft decision on the demodulated signal after the combining and equalization processing using the interference levels detected in the two or more subcarriers to which the same data is assigned and the reliability calculated using the estimation result of the transmission path characteristic.

Thus, OFDM receiving apparatus 500 performs combining processing on the same data assigned to subcarrier k and subcarrier k−(cnum+1) (repeatedly transmitted data), power (reliability) of the transmission path characteristic estimate value and interference power, corrects reliability after the combining according to the interference power after the combining and makes a soft decision on the combined signal based on the corrected reliability.

In this way, OFDM receiving apparatus 500 can obtain an appropriate soft decision value (likelihood) by the combining and equalization processing that can maximize the frequency diversity effect even under a frequency-selective interference environment and reliability correction processing that can reduce the influence of frequency-selective interference.

That is, the resistance to adjacent channel interference can be improved even when a repetition transmission method is applied and OFDM receiving apparatus 500 can perform stable reception processing. Thus, even when the repetition transmission method is applied, the present embodiment can correct deterioration in reception performance due to the influence of frequency-selective interference caused by leakage power of an adjacent channel or the like as in the case of Embodiment 1.

As the combining method in OFDM receiving apparatus 500, any method can be adopted as long as it reduces the influence of frequency-selective interference, and equal gain combining (combining at equal ratio (e.g., equations 1 to 3)) or selective combining may be applied.

As an example of selective combining, OFDM receiving apparatus 500 may compare interference power at different subcarriers to which the same data is assigned and use a signal at a subcarrier having the least interference power. For example, in FIG. 11, combining and equalization section 501 may compare the sum of interference power at subcarriers with minus subcarrier numbers with the sum of interference power at subcarriers with plus subcarrier numbers, select frequency domain OFDM signal Y and transmission path characteristic estimate value H with smaller interference power and calculate demodulated data signal X (=Y/H). Similarly, combined power reliability calculation section 502 may compare the sum of interference power at subcarriers with minus subcarrier numbers with the sum of interference power at subcarriers with plus subcarrier numbers and select power $|H|^2$ of the transmission path characteristic estimate value with smaller interference power as combined power $\hat{H}$. Similarly, combined interference calculation section 503 may compare the sum of interference power at subcarriers with minus subcarrier numbers with the sum of interference power at subcarriers with plus subcarrier numbers and select interference power $|I|^2$ with smaller interference power as interference combined power $\hat{I}$.

The embodiments of the present disclosure have been described so far.

Note that a case has been described in the above-described embodiments where the transmission format (FIG. 1) of 802.11 is used. However, in the above-described embodiments, the transmission format can be any format as long as it includes a preamble made up of pilot subcarriers and null subcarriers and is not limited to the transmission format of 802.11.

In addition, the configuration elements (functional blocks) of the OFDM receiving apparatus used in the description of the embodiments are typically implemented as LSI devices, which are integrated circuits. These functional blocks may be formed as individual chips, or part or all of the functional blocks may be integrated into a single chip. The term "LSI" is used herein, but the terms "IC," "system LSI," "super LSI" or "ultra LSI" may be used as well depending on the level of integration.

In addition, the circuit integration is not limited to LSI and may be achieved by dedicated circuitry or a general-purpose processor other than an LSI. After fabrication of LSI, a field programmable gate array (FPGA), which is programmable, or a reconfigurable processor, which allows reconfiguration of connections and settings of circuit cells in LSI may be used.

Should a circuit integration technology replacing LSI appear as a result of advancements in semiconductor technology or other technologies derived from the technology, the functional blocks could be integrated using such a technology. Another possibility is the application of biotechnology and/or the like.

At least part of the procedure of operation of the OFDM receiving apparatus shown in the above-described embodiments may be written in a program so that, for example, a CPU (Central Processing Unit) may read and execute the program stored in a memory or the program may be stored in a recording medium and distributed, for example.

The OFDM receiving apparatus of the above-described embodiments may be implemented using a reception method that performs at least part of the described reception processing.

The above-described embodiments may also be implemented by combining any receiving apparatus, reception method, reception circuit or program that performs part of the reception processing that implements the above-described embodiments. For example, part of the configuration of the receiving apparatus described in the above-described embodiments may be implemented by a receiving apparatus or integrated circuit, a procedure of operation to be performed by the configuration except the part may be written in a reception program and, for example, a CPU may read and execute the program stored in a memory.

The disclosure of Japanese Patent Application No. 2012-282724, filed on Dec. 26, 2012, including the specification, drawings and abstract is incorporated herein by reference in its entirety.

INDUSTRIAL APPLICABILITY

The present disclosure is applicable to a communication system using a preamble including a short preamble and is useful to correct deterioration in reception performance due to the influence of frequency-selective interference caused by leakage power of an adjacent channel or the like.

REFERENCE SIGNS LIST 100, 200, 300, 400, 500 OFDM receiving apparatus
101 antenna
102 LNA
103 Quadrature detection section
104 AD conversion section
105 Carrier frequency error detection section
106 First frequency correction section
107 First FFT section
108 Estimation section
109 Equalization section
110, 201 Interference detection section
111 Reliability correction section
112 Soft decision section
113 Error correction section
121 De-mapper section
122 Multiplier
151 Null carrier extraction section
152 Power calculation section
251 Pilot carrier extraction section
252 Difference power calculation section
253 Modulation error power calculation section
254 Integration calculation section
301, 401 Delay section
302 Second frequency correction section
303 Second FFT section
501 Combining and equalization section
502 Combined power reliability calculation section
503 Combined interference calculation section

The invention claimed is:

1. A receiving apparatus comprising:
   receiving circuitry, which, in operation, receives a signal including a short preamble and a data period time-multiplexed with the short preamble, the short preamble having a plurality of pilot subcarriers and a plurality of null subcarriers, the plurality of pilot subcarriers being mapped at determined frequency intervals in a transmission band;
   null carrier extraction circuitry, which, in operation, extracts signals of the plurality of null subcarriers from the received signal;
   first interference detection circuitry, which, in operation, detects a plurality of first interference levels of the plurality of subcarriers in the transmission band based on signal levels of the extracted plurality of null subcarriers;
   transmission path estimation circuitry, which, in operation, estimates a transmission path characteristic based on the received signal and determines a plurality of first reliability levels corresponding to the plurality of subcarriers in the transmission band;
   reliability correction circuitry, which, in operation, corrects the plurality of first reliability levels based on the plurality of first interference levels;
   soft decision circuitry, which, in operation, makes a soft decision on a demodulated signal of the received data using the corrected plurality of first reliability levels; and
   error correction circuitry, which, in operation, performs error correction based on a result of the soft decision and reconstructs the received data, wherein the first interference detection circuitry detects power values obtained by subtracting least null subcarrier power from receiving power of the null subcarriers, as the plurality of first interference levels.

2. The receiving apparatus according to claim 1, wherein the first interference detection circuitry, in operation, detects a plurality of fourth interference levels of the plurality of pilot subcarriers included in the short preamble, based on the signal levels of the plurality of null subcarriers.

3. The receiving apparatus according to claim 1, wherein:
   the signal received includes a long preamble in which the plurality of pilot subcarriers are consecutively mapped in a frequency direction and at least two symbols are repeatedly mapped in a time direction,
   the receiving apparatus further comprises:
   pilot carrier extraction circuitry, which, in operation, extracts the signals of the plurality of pilot subcarriers in the long preamble from the received signal; and
   second interference detection which, in operation, detects a plurality of second interference levels of the plurality of subcarriers in the transmission band based on differences between symbols of the signals of the extracted plurality of pilot subcarriers, and
   the reliability correction circuitry, in operation corrects the plurality of first reliability levels based on the plurality of first interference levels and the plurality of second interference levels.

4. The receiving apparatus according to claim 3, comprising:
   delay circuitry, which, in operation, causes the received signal to delay; and
   frequency correction circuitry, which, in operation, applies frequency correction to the delayed signal based on a carrier frequency error detected using the short preamble and the long preamble, wherein
   at least one of the first interference detection circuitry and the second interference detection circuitry, in operation, detects the plurality of first interference levels or the plurality of second interference levels using a signal after the frequency correction.

5. The receiving apparatus according to claim 4, wherein the delay circuitry, in operation, causes the received signal to delay by a time corresponding to the short preamble and the long preamble.

6. The receiving apparatus according to claim 1, wherein:
   the received data comprises a plurality of time-division-multiplexed symbols, each of the symbols including a signal in which data is multiplexed with a plurality of subcarriers at determined frequency intervals in the transmission band,
   the receiving apparatus comprises third interference detection circuitry, which, in operation, makes a hard decision on the demodulated signal of the received data and that detects a plurality of third interference levels of the plurality of subcarriers in the transmission band based on an error from the hard decision result of the demodulated signal, and
   the reliability correction circuitry, in operation, corrects the plurality of first reliability levels based on the plurality of first interference levels and the plurality of third interference levels.

7. The receiving apparatus according to claim 1, comprising:
   delay circuitry, which, in operation, causes the received signal to delay; and
   frequency correction circuitry, which, in operation, applies frequency correction to the delayed signal based on a carrier frequency error detected using the short preamble, wherein
   the first interference detection circuitry, in operation, detects the plurality of first interference levels using the signal after the frequency correction.

8. The receiving apparatus according to claim 7, wherein the delay circuitry, in operation, causes the received signal to delay by a time corresponding to the short preamble.

9. A receiving apparatus, comprising:
   receiving circuitry, which in operation, receives a signal including a short preamble and a data period time-multiplexed with the short preamble, the short preamble having a plurality of pilot subcarriers and a plurality of null subcarriers, the plurality of pilot subcarriers being mapped at determined frequency intervals in a transmission band, the data period including identical data assigned to two or more subcarriers in the transmission band;
   null carrier extraction circuitry, which, in operation, extracts signals of the plurality of null subcarriers from the received signal;
   first interference detection circuitry, which, in operation, detects a plurality of first interference levels of the two or more subcarriers in the transmission band based on signal levels of the extracted plurality of null subcarriers;
   transmission path estimation circuitry, which, in operation, estimates a transmission path characteristic based on the received signal and determines a plurality of first reliability levels corresponding to the two or more subcarriers to which the identical data is assigned of the two or more subcarriers in the transmission band;
   reliability correction circuitry, which, in operation, corrects the plurality of first reliability levels based on the plurality of first interference;
   soft decision circuitry, which, in operation, makes a soft decision on a demodulated signal of the received data using the corrected plurality of first reliability levels; and
   error correction circuitry, which in operation, performs error correction based on a result of the soft decision and reconstructs the received data;
   combining and equalization circuitry, which, in operation, performs combining and equalization processing on the identical data assigned to the two or more subcarriers, using a plurality of second interference levels corresponding to the two or more subcarriers to which the identical data is assigned and an estimation result of the transmission path characteristic, wherein,
   the soft decision circuitry, in operation, makes the soft decision on the demodulated signal after the combining and equalization processing using the plurality of second interference levels and the corrected plurality of first reliability levels.

10. The receiving apparatus according to claim 9, comprising:
    reliability calculation circuitry, which, in operation, calculates a combined reliability level for the identical data assigned to the two or more subcarriers using the plurality of second interference levels and the transmission path characteristic estimation result, wherein
    the soft decision circuitry, in operation, makes the soft decision on the demodulated signal after the combining and equalization processing using the combined reliability level.

11. The receiving apparatus according to claim 10, comprising:
    combined interference calculation circuitry, which, in operation, calculates a combined interference level for the identical data assigned to the two or more subcarriers using the plurality of second interference levels and the estimation result of the transmission path characteristic; wherein
    the reliability correction circuitry, in operation, corrects the combined reliability level based on the combined interference level, and
    the soft decision circuitry, in operation, makes the soft decision on the demodulated signal after the combining and equalization processing using the corrected combined reliability level.

12. A frequency-selective interference correction method for a receiving apparatus that receives a signal transmitted from a transmitting apparatus using a transmission format comprising a short preamble and a data period, the short preamble having pilot subcarriers mapped at redetermined intervals in a transmission band, and a null subcarrier other than the pilot subcarriers in the transmission band, the method comprising:
    estimating an estimate value of a transmission path characteristic between the transmitting apparatus and the receiving apparatus using the received signal and determining a reliability level for each subcarrier in the transmission band based on the estimate value;

detecting interference power in all subcarriers in the transmission band based on received power of the null subcarrier in the short preamble of the received signal;

correcting the reliability level according to the interference power;

making a soft decision on a demodulated signal of the received data based on the corrected reliability level; and performing error correction based on a result of the soft decision, wherein the interference power is obtained by subtracting least null subcarrier power from receiving power of the null subcarriers.

13. A receiving apparatus, comprising:

receiving circuitry, which, in operation, receives a signal including a short preamble and a data period time-multiplexed with the short preamble, the short preamble having a plurality of pilot subcarriers and a plurality of null subcarriers, the plurality of pilot subcarriers being mapped at determined frequency intervals in a transmission band;

null carrier extraction circuitry, which, in operation, extracts signals of the plurality of null subcarriers from the received signal;

first interference detection circuitry, which, in operation, detects a plurality of first interference levels of the plurality of subcarriers in the transmission band based on signal levels of the extracted plurality of null subcarriers;

transmission path estimation circuitry, which, in operation, estimates a transmission path characteristic based on the received signal and determines a plurality of first reliability levels corresponding to the plurality of subcarriers in the transmission band;

reliability correction circuitry, which, in operation, corrects the plurality of first reliability levels based on the plurality of first interference levels;

soft decision circuitry, which, in operation, makes a soft decision on a demodulated signal of the received data using the corrected plurality of first reliability levels; and error correction circuitry, which, in operation, performs error correction based on a result of the soft decision and reconstructs the received data, wherein the first interference detection circuitry, in operation, detects power values obtained by subtracting average null subcarrier power from a sum of power of null subcarriers from receiving power of the null subcarriers, as the plurality of first interference levels.

* * * * *